(12) United States Patent
Escamilla et al.

(10) Patent No.: US 11,606,887 B2
(45) Date of Patent: Mar. 14, 2023

(54) SYSTEM FOR ELECTROMAGNETIC INTERFERENCE SHIELDING

(71) Applicant: Dell Products L.P., Round Rock, TX (US)

(72) Inventors: Eduardo Escamilla, Round Rock, TX (US); Bernard D. Strmiska, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 10 days.

(21) Appl. No.: 17/379,634

(22) Filed: Jul. 19, 2021

(65) Prior Publication Data

US 2023/0017214 A1   Jan. 19, 2023

(51) Int. Cl.
*H05K 9/00*   (2006.01)
*H05K 7/14*   (2006.01)

(52) U.S. Cl.
CPC ......... *H05K 9/0007* (2013.01); *H05K 7/1415* (2013.01); *H05K 7/1489* (2013.01)

(58) Field of Classification Search
None
See application file for complete search history.

(56) References Cited

U.S. PATENT DOCUMENTS

| | | | | |
|---|---|---|---|---|
| 6,542,383 B1 * | 4/2003 | Tsuyuki | ............... | H05K 9/0016 361/728 |
| 7,626,810 B1 * | 12/2009 | Kim | ............... | G06F 1/187 361/679.33 |
| 2003/0011979 A1 * | 1/2003 | Tanzer | ............... | G06F 1/184 361/679.33 |
| 2004/0095716 A1 * | 5/2004 | McAlister | ............... | G06F 1/184 361/679.33 |
| 2005/0049825 A1 * | 3/2005 | King | ............... | G06F 11/0757 702/177 |
| 2007/0153489 A1 * | 7/2007 | Fan | ............... | H05K 9/0016 361/753 |
| 2008/0013272 A1 * | 1/2008 | Bailey | ............... | G06F 1/187 361/679.33 |
| 2008/0043454 A1 * | 2/2008 | Titus | ............... | H05K 7/1487 361/818 |
| 2008/0205026 A1 * | 8/2008 | Gallarelli | ............... | G11B 33/12 361/818 |
| 2009/0086421 A1 * | 4/2009 | Olesiewicz | ............... | H05K 9/0016 361/679.33 |
| 2010/0149746 A1 * | 6/2010 | Crippen | ............... | H05K 9/0062 361/679.33 |
| 2017/0188485 A1 * | 6/2017 | Peterson | ............... | H05K 7/20772 |
| 2017/0269644 A1 * | 9/2017 | Kwon | ............... | G11B 33/08 |

* cited by examiner

*Primary Examiner* — James Wu
*Assistant Examiner* — Christopher L Augustin
(74) *Attorney, Agent, or Firm* — Chamberlain, Hrdlicka, White, Williams & Aughtry

(57) ABSTRACT

A drive carrier for retaining a persistent storage drive in an enclosure. The drive carrier includes a mounting bracket, a handle coupled to the mounting bracket, and an electromagnetic interference ("EMI") shielding apparatus disposed between mounting bracket and at least a portion of the handle. The mounting bracket is shaped to be coupled to the persistent storage drive. The EMI-shielding apparatus includes a plurality of EMI-shielding fingers. Each EMI-shielding finger includes a lower surface, an upper surface that is approximately parallel to the lower surface, and a contoured surface extending between the lower surface and the upper surface.

17 Claims, 8 Drawing Sheets

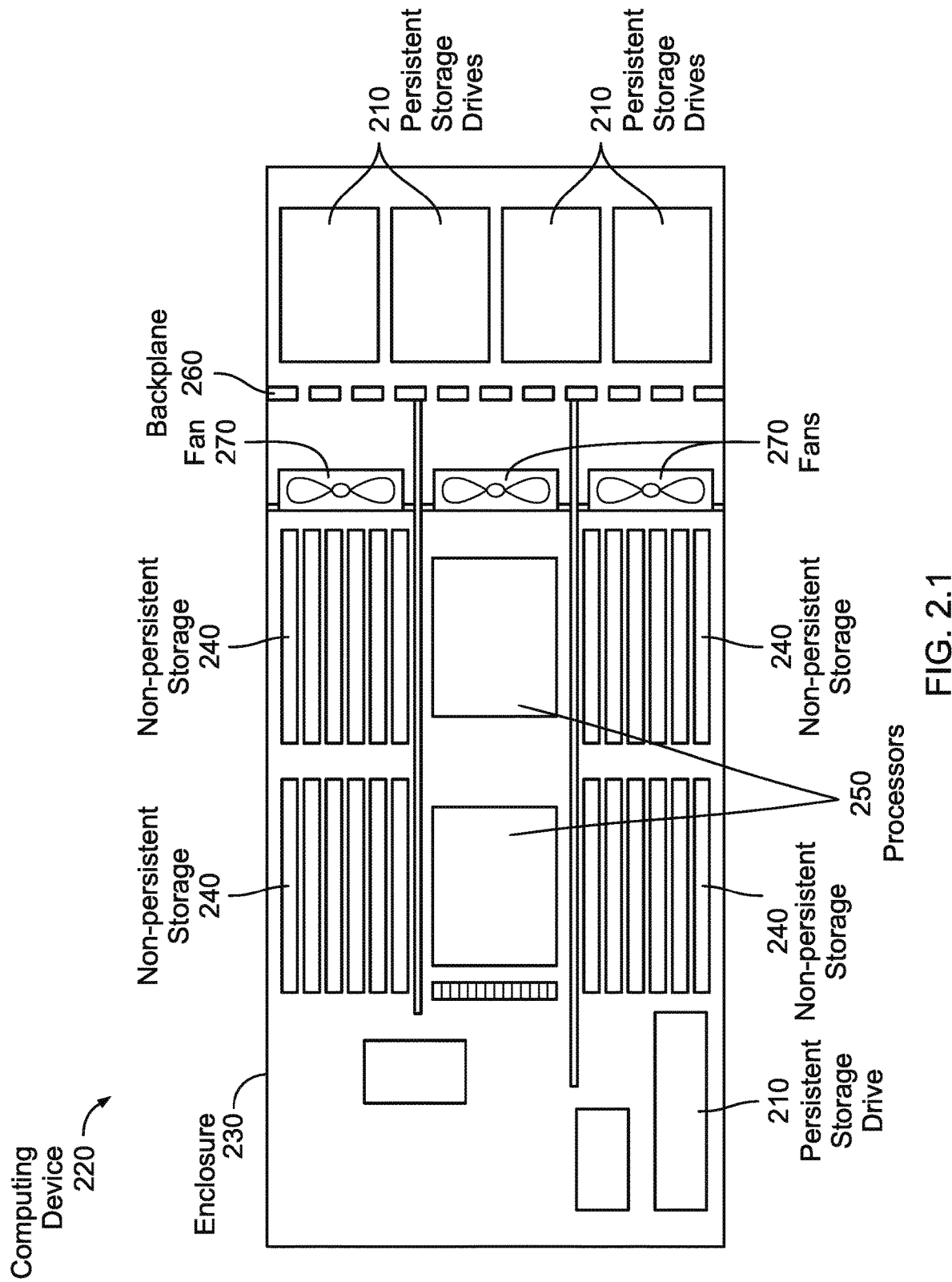
FIG. 2.1

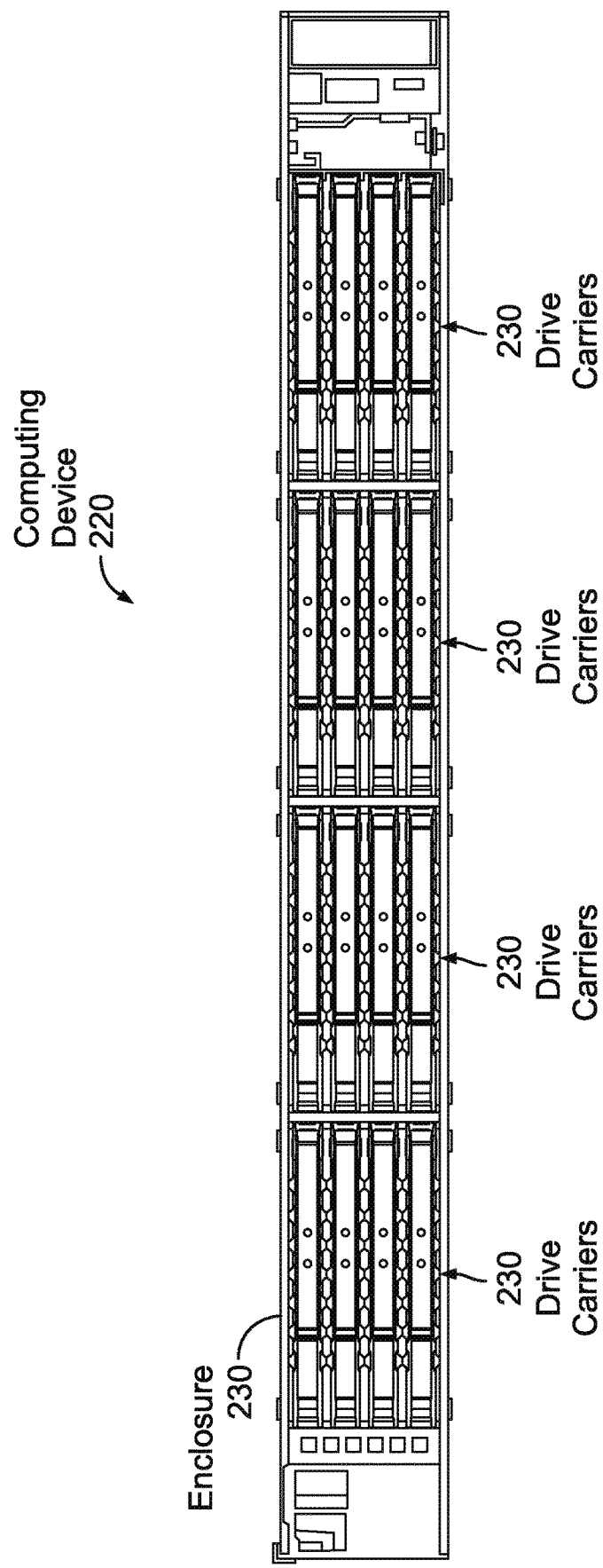
FIG. 2.2

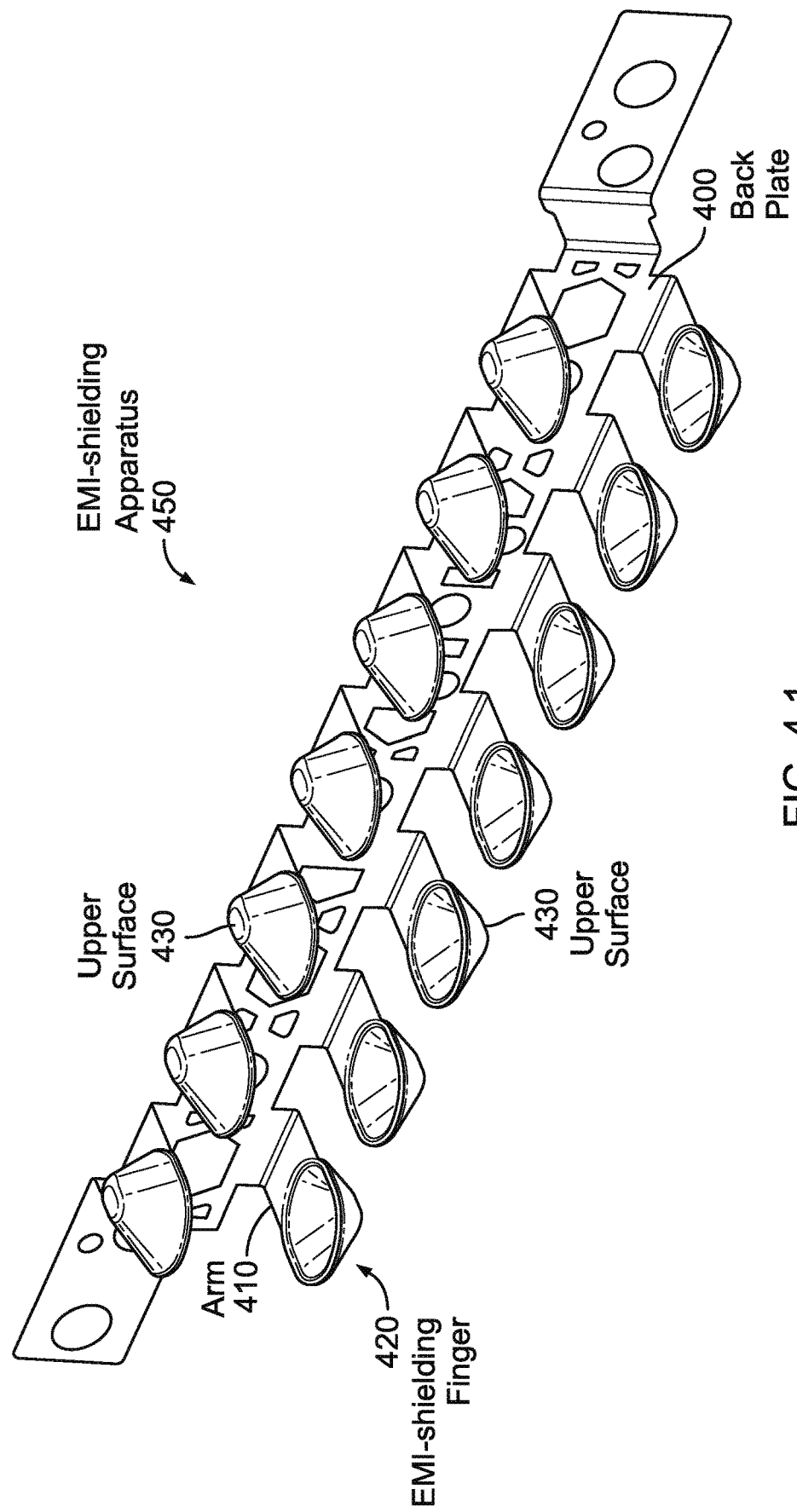
FIG. 4.1

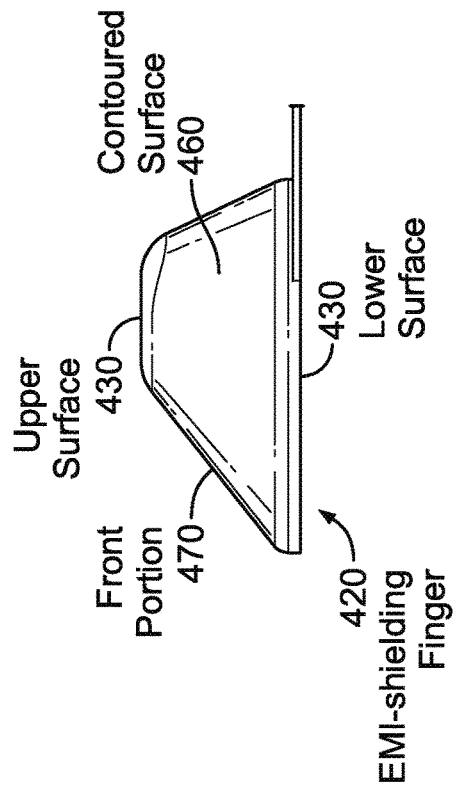
FIG. 4.3
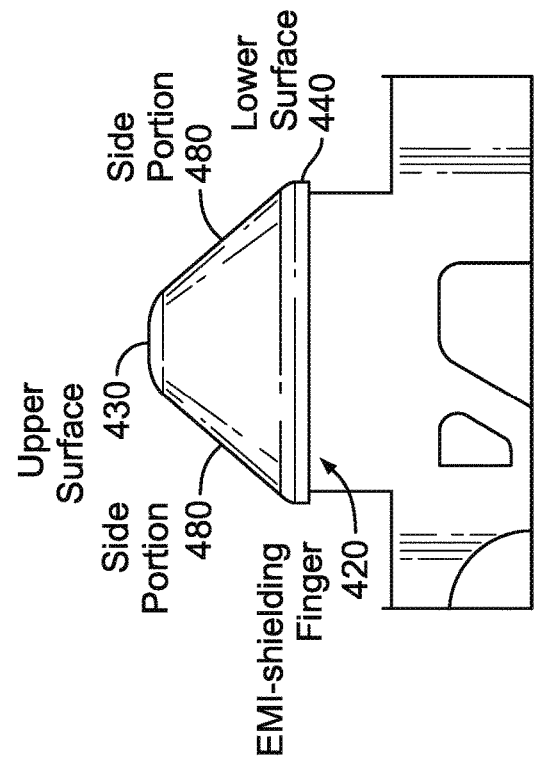
FIG. 4.4
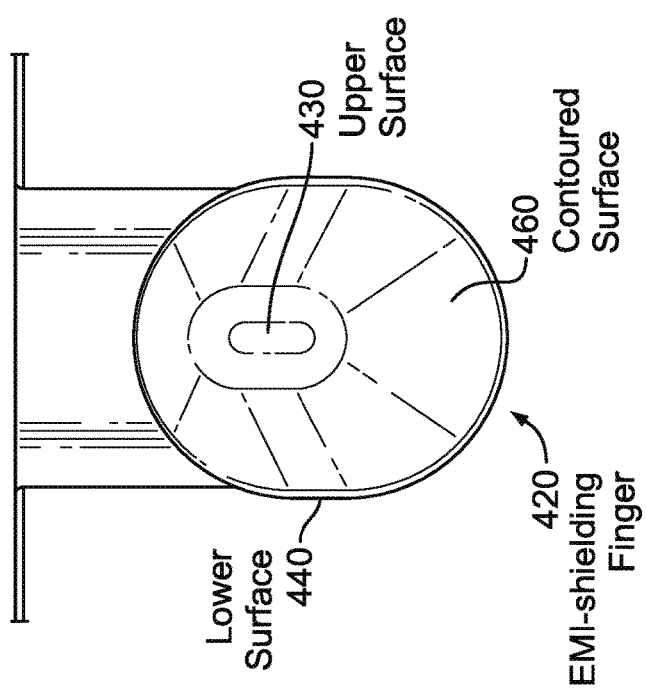
FIG. 4.2

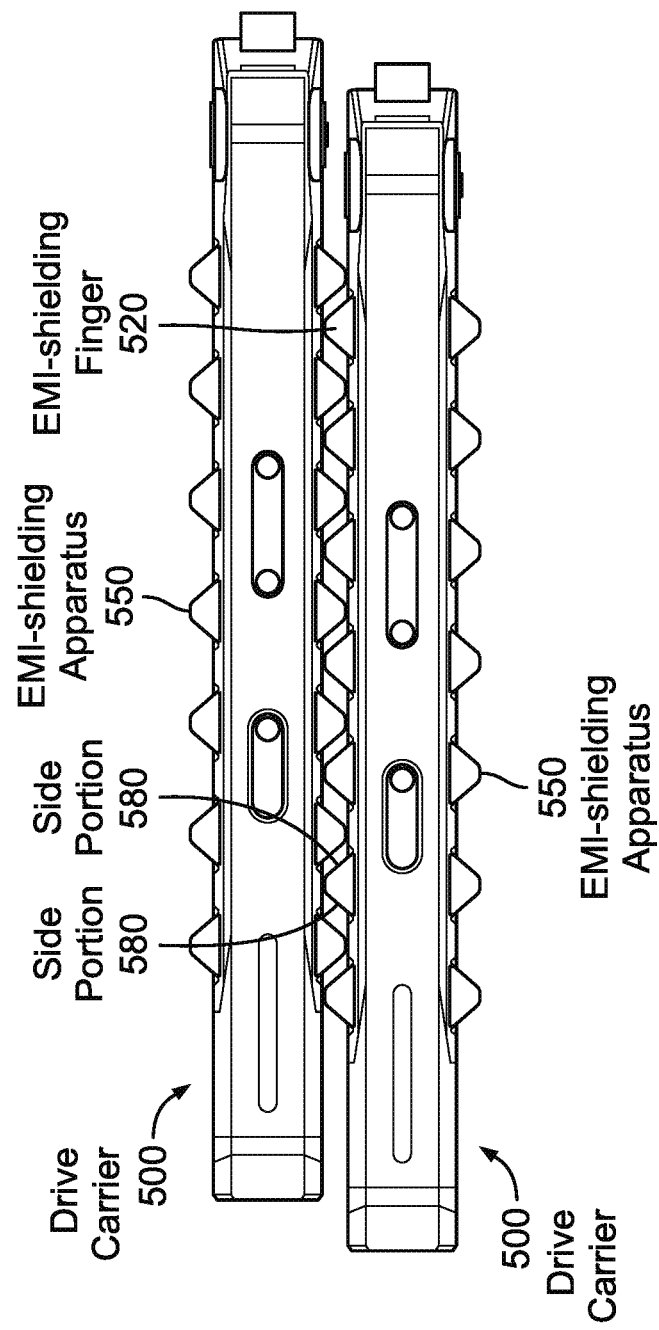
FIG. 5.1

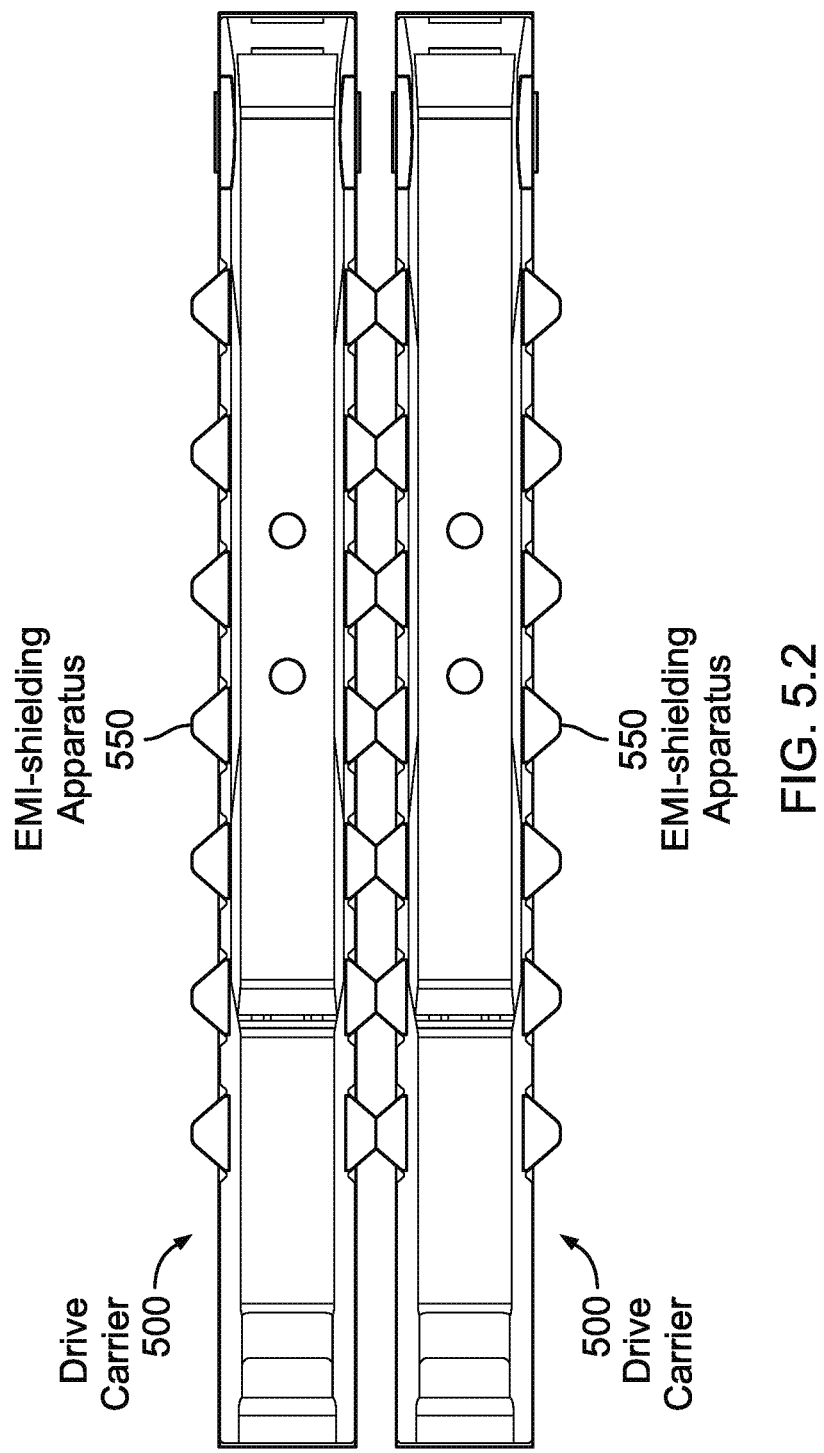
FIG. 5.2

SYSTEM FOR ELECTROMAGNETIC INTERFERENCE SHIELDING

BACKGROUND

Computing devices may perform services. In order to provide the services, the computing devices may include hardware components and software components. The software components may utilize the hardware components to provide the services. Electromagnetic interference ("EMI") may negatively affect a computing device while it is performing the aforementioned services.

SUMMARY

In one aspect, a drive carrier for retaining a persistent storage drive in an enclosure. The drive carrier includes a mounting bracket, a handle coupled to the mounting bracket, and an electromagnetic interference ("EMI") shielding apparatus disposed between mounting bracket and at least a portion of the handle. The mounting bracket is shaped to be coupled to the persistent storage drive. The EMI shielding apparatus includes a plurality of EMI-shielding fingers. Each EMI-shielding finger includes a lower surface, an upper surface that is approximately parallel to the lower surface, and a contoured surface extending between the lower surface and the upper surface.

In one aspect, a computing device. The computing device includes an enclosure, a plurality of persistent storage drives, and a plurality of drive carriers. Each drive carrier is coupled to the enclosure and a persistent storage drive of the plurality of storage. Each drive carrier includes a mounting bracket, a handle coupled to the mounting bracket, and an EMI shielding apparatus disposed between mounting bracket and at least a portion of the handle. The mounting bracket is coupled to the persistent storage drive of the plurality of persistent storage drives. The EMI shielding apparatus includes a plurality of EMI-shielding fingers. Each EMI-shielding finger includes a lower surface, an upper surface that is approximately parallel to the lower surface, and a contoured surface extending between the lower surface and the upper surface.

In one aspect, a computing system including a plurality of computing devices. Each computing device includes an enclosure, a plurality of persistent storage drives, and a plurality of drive carriers. Each drive carrier is coupled to the enclosure and a persistent storage drive of the plurality of storage. Each drive carrier includes a mounting bracket, a handle coupled to the mounting bracket, and an EMI shielding apparatus disposed between mounting bracket and at least a portion of the handle. The mounting bracket is coupled to the persistent storage drive of the plurality of persistent storage drives. The EMI shielding apparatus includes a plurality of EMI-shielding fingers. Each EMI-shielding finger includes a lower surface, an upper surface that is approximately parallel to the lower surface, and a contoured surface extending between the lower surface and the upper surface.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 2.1 shows a diagram of a computing device in accordance with one or more embodiments of the invention.

FIG. 2.2 shows a front view of the computing device of FIG. 2.1.

FIG. 4.1 shows an isometric view of EMI-shielding fingers in accordance with one or more embodiments of the invention.

FIG. 4.2 shows a top view of the EMI-shielding finger of the drive carrier of FIG. 4.1.

FIG. 4.3 shows a side view of the EMI-shielding finger of the drive carrier of FIG. 4.1.

FIG. 4.4 shows a front view of the EMI-shielding finger of the drive carrier of FIG. 4.1.

FIG. 5.1 shows a front view of two drive carriers immediately after a shock event in accordance with one or more embodiments of the invention.

FIG. 5.2 shows a front view of the two drive carriers of FIG. 5 having repositioned themselves after the shock event.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention provide electromagnetic interference ("EMI") shielding to a computing device. The computing device may be a computing device that provides computer-implemented services. These services may include, for example, database services, electronic communication services, data storage services, etc.

The computing devices may include any number of computing components that facilitate providing the services of the computing device. The computing components may include, for example, processors, non-persistent storage drives, persistent storage drives, circuit cards that interconnect these components, etc. Often, many computing devices are located in one area. This leads to the generation of electromagnetic ("EM") waves, which can cause electromagnetic interference with a computing device, negatively affecting the function and/or stability of the computing device.

In one or more embodiments of the invention, the EMI shielding system includes EMI-shielding fingers that provide a barrier to reduce the number or the strength of EM waves entering the computing device, as well as reducing the number or the strength of EM waves exiting the computing device. The reduction of EM waves entering and exiting the computing device may improve the stability or function of the computing device as it provides computer-implemented services.

Figure 1:
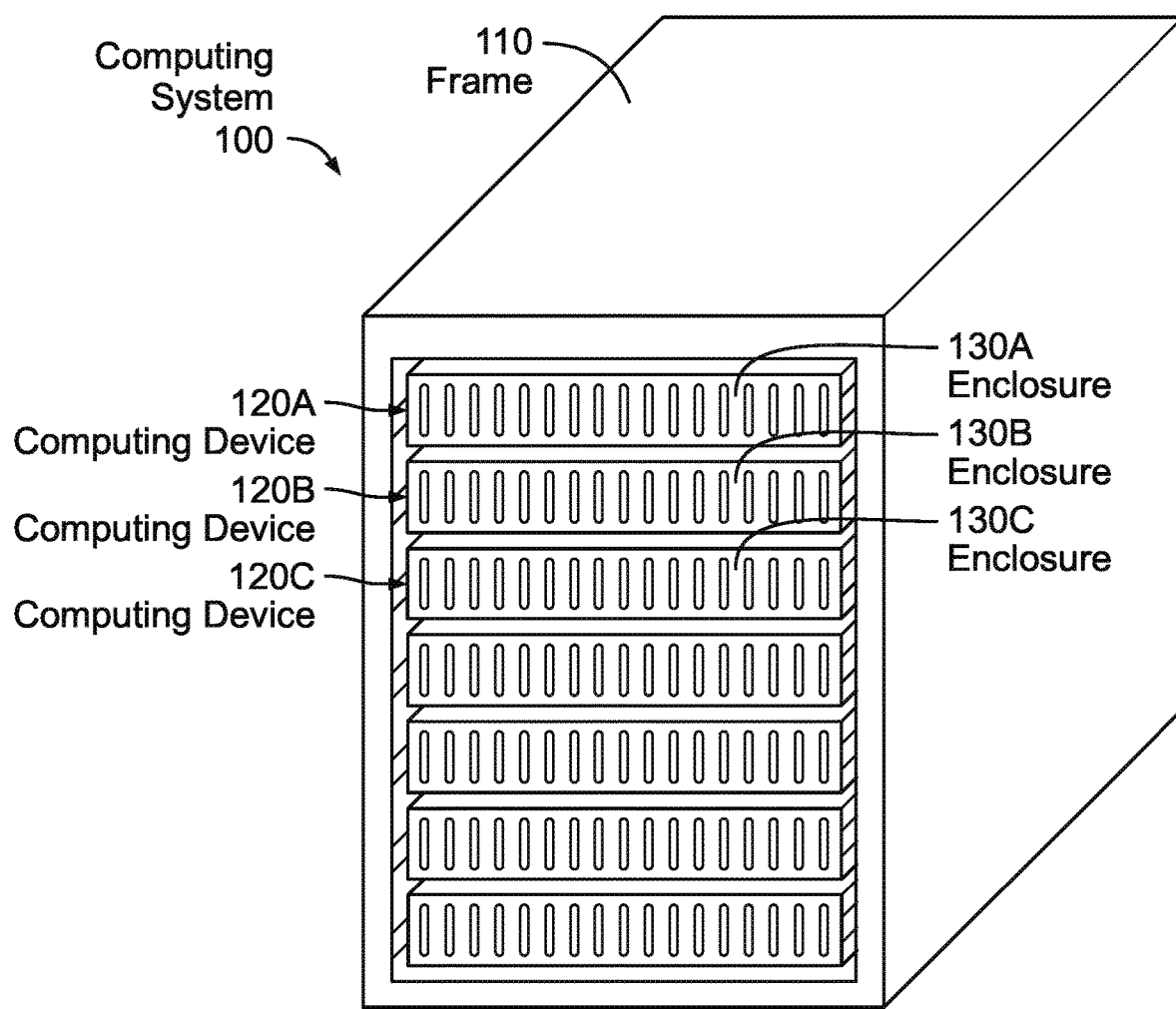
FIG. 1 shows a diagram of a computing device in accordance with one or more embodiments of the invention.

FIG. 1 shows a computing system (100) in accordance with one or more embodiments of the invention. The system may include a frame (110) and any number of computing devices (e.g., 120A, 120B, 120C).

The frame (110) may be a mechanical structure that enables computing devices (e.g., 120A, 120B, 120C) to be positioned with respect to one another. For example, the frame (110) may be a computing system mount that enables computing devices (e.g., 120A, 120B, 120C) to be disposed within it. The frame (110) may be implemented as other types of structures adapted to house, position, orient, and/or otherwise physically, mechanically, electrically, and/or thermally manage computing devices (e.g., 120A, 120B, 120C). By managing the computing devices (e.g., 120A, 120B, 120C), the frame (110) may enable multiple computing devices to be densely packed in a space without negatively impacting the operation of the computing system (100).

An enclosure (e.g., 130A, 130B, 130C) may be a mechanical structure for components of a computing device (e.g., 120A, 120B, 120C). For example, an enclosure (e.g., 130A, 130B, 130C) may be implemented as a computing system mountable enclosure (e.g., 130A, 130B, 130C) for components of a computing device (e.g., 120A, 120B, 120C). The enclosure (e.g., 130A, 130B, 130C) may be adapted to be disposed within the frame (110) and/or utilize services provided by the frame (110) and/or other devices.

Any number of components may be disposed in each of the respective enclosures (e.g., 130A, 130B, 130C). These components may be portions of computing devices (e.g., 120A, 120B, 120C) that provide computer implemented services. To provide services, the computing device (e.g., 120A, 120B, 120C) may utilize computing resources provided by computing components. The computing components may include, for example, processors, non-persistent storage drives, persistent storage drives, special purpose hardware, and/or other types of physical components that contribute to the operation of the computing device.

While the computing device (e.g., 120A, 120B, 120C) provides computer-implemented services, electromagnetic waves may be directed at the computing device (e.g., 120A, 120B, 120C). For example, adjacent computing devices (e.g., 120A, 120B, 120C) or other electronic equipment may emit EM waves that are directed towards the computing device (e.g., 120A, 120B, 120C). If the computing device (e.g., 120A, 120B, 120C) is left unshielded, the EMI due to the EM waves may cause corrupted or dropped packets during transfers of information performed by the computing device. Additionally, data stored on storage devices within the computing device (e.g., 120A, 120B, 120C) may be corrupted or lost due to EMI.

By utilizing the EMI shielding system in accordance with this invention, EM waves may be reduced in strength or in number, or prevented from entering the enclosure (e.g., 130A, 130B, 130C) of the computing device (e.g., 120A, 120B, 120C), improving stability of the computing device (e.g., 120A, 120B, 120C) while the computing device (e.g., 120A, 120B, 120C) is positioned adjacent to other computing devices (e.g., 120A, 120B, 120C), as shown in FIG. 1.

Turning now to FIG. 2.1, FIG. 2.1 shows a diagram of a computing device (220) in accordance with one or more embodiments of the invention. The computing device may provide any number of services (e.g., computing implemented services). To provide services, the computing device may utilize computing resources provided by computing components housed within an enclosure (230).

The computing components may include, for example, persistent storage drives (210), non-persistent storage drives (240), processors (250), and/or other types of physical components that contribute to the operation of the computing device (220). In other embodiments, one or more of the computing components (e.g., 210, 240, 250) may be omitted or additional computing components may be added within the enclosure (230) based on the services provided by the computing device. The persistent storage drives may be connected to a backplane (260) to allow the persistent storage drives (210) to be quickly installed in and removed from the computing device (220). Additionally, the computing device may allow the persistent storage drives (210) to be installed and/or removed while the computing device (220) is in operation.

In one embodiment of the invention, the computing device (220) also includes fans (270) that draw air into the enclosure (230) and over the computing components (e.g., 210, 240, 250) to cool the components (e.g., 210, 240, 250). In other embodiments, liquid cooling or a combination of fans and liquid cooling may be used to cool the computing components (e.g., 210, 240, 250). For additional details regarding computing devices, refer to FIG. 5.

Turning now to FIG. 2.2, FIG. 2.2 is a front view of the computing device (220) of FIG. 2.1. In one or more embodiments of the invention, the computing device (220) includes multiple drive carriers (200) that, in turn, include the persistence storage drives (210, FIG. 2.1), as described in more detail below. The drive carriers (200) are installed within the enclosure (230) and, once installed, align the connectors of the persistent storage drives (210, FIG. 2.1) with mating connectors on the backplane (260, FIG. 2.1). Further, the drive carriers (200) are positioned on a portion of the enclosure (230) that is exposed when the computing device is positioned in a frame (e.g., 110, FIG. 1). This positioning allows drive carriers (200) containing the persistent storage devices (210, FIG. 2.1) to be installed or removed from the computing device (220) without accessing the inside of the enclosure (230).

Figure 3:
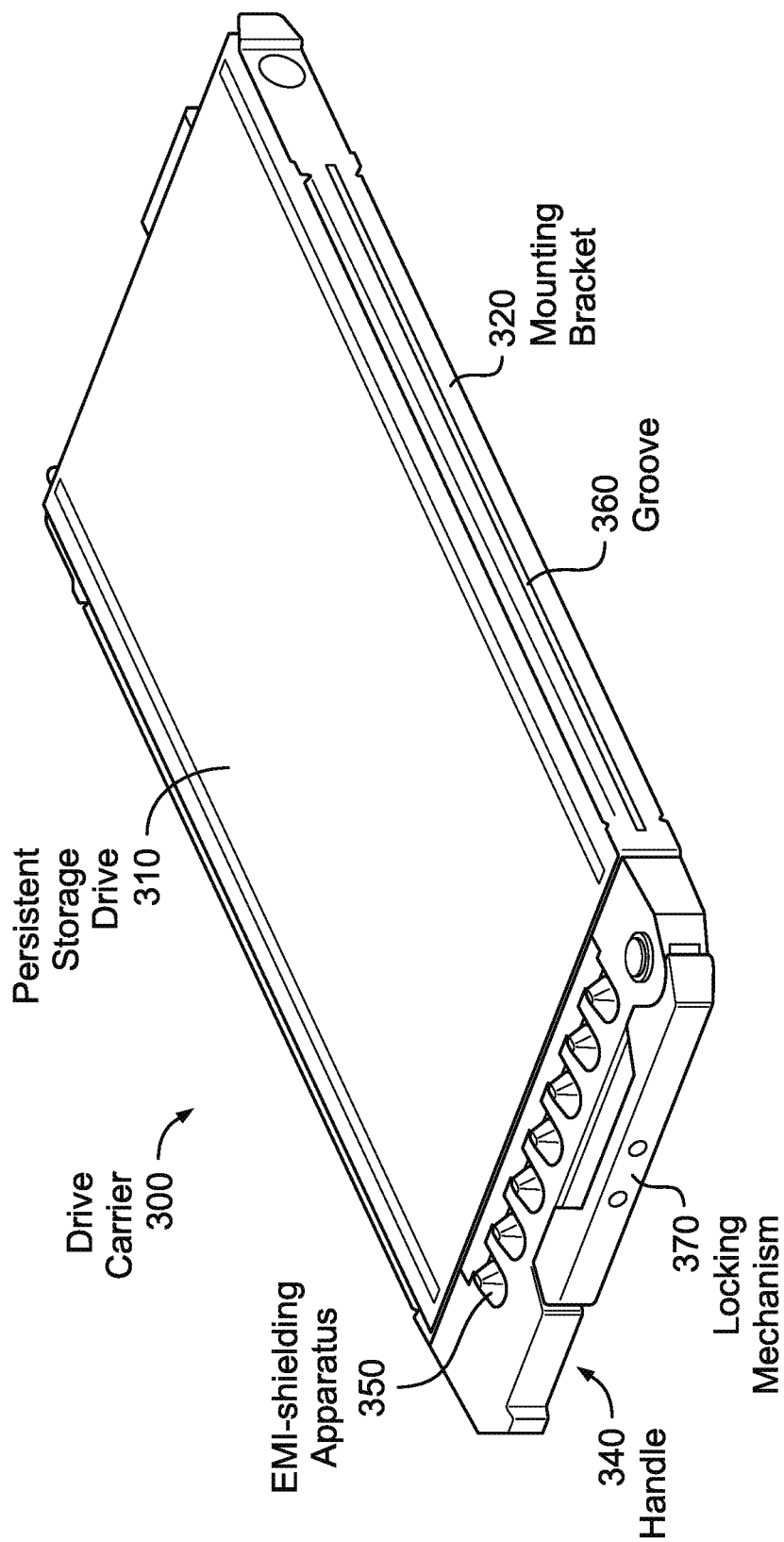
FIG. 3 shows an isometric view of a drive carrier in accordance with one or more embodiments of the invention.

Turning now to FIG. 3, FIG. 3 is a drive carrier (300) according to one or more embodiments of the invention. The drive carrier includes a persistent storage drive (310), a mounting bracket (320), a handle (340), and an EMI-shielding apparatus (350).

The mounting bracket (320) is coupled to a persistent storage drive (310) via fasteners or pins extending from the mounting bracket (320) and into holes in the persistent storage drive (310). The mounting bracket is sized to be coupled to one of a number of persistent storage drive form factors, such as, but not limited to, 3.5 inch, 2.5 inch, and EDSFF form factors. Additionally, some embodiments of the invention may include an adapter that allows the mounting bracket (320) to be coupled to a persistent storage drive having a different form factor than the mounting bracket (320). Further, the mounting bracket (320) may include grooves (360) or rails that engage with mating grooves or rails of the computing device (e.g., 220, FIG. 2.2) to properly align the drive carrier (300) and persistent storage drive (310) within the computing device (e.g., 220, FIG. 2.2).

The handle (340) may be coupled to or portions of the handle (340) may be formed by the mounting bracket (320). In one or more embodiments of the invention, a locking mechanism (370) of the handle (340) may shift from a locked position, as shown in FIG. 3, to an open position to releasably couple the drive carrier (300) and persistent storage drive (310) to and release the drive carrier (300) and persistent storage drive (310) from the enclosure (e.g. 230, FIG. 2.2) of the computing device (e.g., 220, FIG. 2.2). In other embodiments, the handle may include other mechanisms, such as spring clips, to retain the drive carrier (300) and persistent storage drive (310) in position within the enclosure (e.g. 230, FIG. 2.2) of the computing device (e.g., 220, FIG. 2.2).

The EMI-shielding apparatus (350) is electrically conductive and coupled to the handle (340 and/or the mounting bracket (320) such that the EMI shielding apparatus (350) is disposed between the mounting bracket (320) and at least a portion of the handle (340). The EMI-shielding apparatus (350) of one drive carrier (300) contacts the EMI-shielding apparatus (350) of adjacent drive carriers (300) when the drive carriers (300) are positioned within a computing device (e.g., 220, FIG. 2.2). Additionally, the gaps between the EMI-shielding apparatus (350) also create a flow path for air entering the computing device (e.g., 220, FIG. 2.2).

The EMI-shielding apparatus (350) of drive carriers (300) adjacent to the enclosure (e.g., 230, FIG. 2.2) also contact the enclosure (e.g., 230, FIG. 2.2), as shown in FIG. 2.2, grounding the EMI-shielding apparatus (350) of all drive carriers (300) within the computing device (e.g. 220, FIG. 2.2). The grounded EMI-shielding fingers create a barrier that reduces the number and/or strength of EM waves generated by adjacent electrical devices that may enter the computing device (e.g., 220, FIG. 2.2) or prevents the EM waves generated by adjacent electrical devices from entering the computing device (e.g., 220, FIG. 2.2). Similarly, the grounded EMI-shielding fingers create a barrier that reduces the number and/or strength of EM waves generated by the computing device (e.g., 220, FIG. 2.2) as the EM waves exit the computing device (e.g., 220, FIG. 2.2) or prevents the EM waves generated by the computing device (e.g., 220, FIG. 2.2) from exiting the computing device (e.g., 220, FIG. 2.2).

Turning now to FIGS. 4.1-4.4, FIGS. 4.1-4.4 show views of EMI-shielding apparatus (450) according to one or more embodiments of the invention. As shown in FIG. 4.1, each EMI-shielding finger (one indicated, 420) of the EMI-shielding apparatus (450) is coupled to a common back plate (400) via arms (one indicated, 410) extending between the back plate (400) and the EMI-shielding finger (420). The EMI-shielded fingers (420) are positioned via the arms such that the EMI-shielding fingers (420) are paired across the length of the back plate (400), the upper surfaces (430) of a respective pair facing opposite directions. In one or more embodiments of the invention, the arms (410) also act as springs, allowing an EMI-shielding finger to be retracted into the handle (e.g., 340, FIG. 3) when pressure is applied to the upper surface and/or the contoured surface of the EMI-shielding finger, preventing damage to the EMI-shielding fingers when the drive carrier (e.g., 300, FIG. 3) is not positioned within a computing device (e.g., 220, FIG. 2.2).

Each EMI-shielding finger includes an upper surface (430), a lower surface (440), and a contoured surface (460) extending between the upper surface (430) and the lower surface (440). A front portion (470) of the contoured surface of each EMI-shielding finger have an angle within a range of approximately 30 degrees to approximately 45 degrees with respect to a horizontal plane. The angle of the front portion (470) of the EMI-shielding finger (420) may aid in the installation and removal of the drive carrier (e.g., 300, FIG. 3) from a computing device (e.g., 220, FIG. 2). Similarly, side portions (480) of the contoured surface of each EMI-shielding finger that are approximately perpendicular to the back plate (400) have an angle within a range of approximately 45 degrees to approximately 60 degrees with respect to a horizontal plane.

Turning now to FIG. 5.1, FIG. 5.1 is a front view of two drive carriers (500) immediately after a shock event, in accordance with one or more embodiments of the invention. A shock event is an impact to an enclosure (e.g., 230, FIG. 2.1) or sudden, intense vibration of the enclosure (e.g., 230, FIG. 2.1) that causes the EMI-shielding apparatus (550) of the drive carriers (500) within the enclosure to be misaligned, as shown in FIG. 5.1.

The angled surface of the side portions (two indicated, 580) of each finger (one indicated, 520) facilitate the repositioning of vertically adjacent drive carriers (500) to their initial position, shown in FIG. 5.2, after a shock event, e.g., an impact or sudden, intense vibration, causes misalignment of the drive carriers 500, shown in FIG. 5.1, without the need for intervention by a technician. This ensures that respective persistent storage drives (e.g., 310, FIG. 3) within the drive carriers (500) quickly reconnect to the backplane (e.g., 260, FIG. 2.1) of a computing device (e.g., 220, FIG. 2.1) after a shock event, minimizing the loss of access to the data stored on the persistent storage drives (e.g., 310, FIG. 3).

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

As used herein, a range is intended to include the upper and lower limits of the range; e.g., a range of 50 to 150 includes both 50 and 150. Additionally, the term "approximately" includes all values within 5% of the target value; e.g., approximately 100 includes all values from 95 to 105, including 95 and 105. Further, "approximately between" includes all values within 5% of the target value for both the upper and lower limits; e.g., approximately between 50 and 150 includes all values from 47.5 to 157.5, including 47.5 and 157.5.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A drive carrier for retaining a persistent storage drive in an enclosure, the drive earner comprising:
   a mounting bracket shaped to be coupled to the persistent storage drive;
   a handle coupled to the mounting bracket; and an electromagnetic interference ("EMI")-shielding apparatus disposed between mounting bracket and at least a portion of the handle, the EMI shielding apparatus comprising:
  a plurality of EMI-shielding fingers, each EMI-shielding finger comprising a lower surface, an upper surface approximately parallel to the lower surface, and a contoured surface extending between the lower surface and the upper surface,
  a back plate, and
  at least one arm extending between the back plate and the EMI-shielding finger, wherein each EMI-shielding finger of the plurality of EMI-shielding fingers is coupled to the back plate by the at least one arm extending between the back plate and the EMI-shielding finger.

2. The drive carrier of claim 1, wherein each EMI-shielding finger of the plurality of EMI-shielding fingers is retractable into the handle.

3. The drive carrier of claim 2, wherein each EMI-shielding finger of the plurality of EMI-shielding fingers is individually retractable upon a pressure being applied to at least one of the upper surface or the contoured surface of the respective EMI-shielding finger.

4. The drive carrier of claim 1, wherein side portions of each EMI-shielding finger that are approximately perpendicular to the back plate have an angle within a range of approximately 45 degrees to approximately 60 degrees with respect to a horizontal plane.

5. The drive carrier of claim 1, wherein the EMI-shielding fingers are positioned in pairs along a length of the back plate and upper surfaces of EMI-shielding fingers of each respective pair of EMI-shielding fingers face opposite directions.

6. A computing device comprising:
an enclosure;
a plurality of persistent storage drives; and
a plurality of drive carriers, each drive carrier coupled to the enclosure and a persistent storage drive of the plurality of persistent storage drives and comprising:
  a mounting bracket coupled to a persistent storage drive of the plurality of persistent storage drives;
  a handle coupled to the mounting bracket; and
  an EMI-shielding apparatus disposed between mounting bracket and at least a portion of the handle, the EMI shielding apparatus comprising:
    a plurality of EMI-shielding fingers, each EMI-shielding finger comprising a lower surface, an upper surface approximately parallel to the lower surface, and a contoured surface extending between the lower surface and the upper surface,
    a back plate, and
    at least one arm extending between the back plate and the EMI-shielding finger, wherein each EMI-shielding finger of the plurality of EMI-shielding fingers is coupled to the back plate by the at least one arm extending between the back plate and the EMI-shielding finger.

7. The computing device of claim 6, wherein each EMI-shielding finger of the plurality of EMI-shielding fingers is retractable into the handle.

8. The computing device of claim 7, wherein each EMI-shielding finger of the plurality of EMI-shielding fingers is individually retractable upon a pressure being applied to at least one of the upper surface or the contoured surface of the respective EMI-shielding finger.

9. The computing device of claim 6, wherein side portions of each EMI-shielding finger that are approximately perpendicular to the back plate have an angle within a range of approximately 45 degrees to approximately 60 degrees with respect to a horizontal plane.

10. The computing device of claim 6, wherein the EMI-shielding fingers are positioned in pairs along a length of the back plate and upper surfaces of EMI-shielding fingers of each respective pair of EMI-shielding fingers face opposite directions.

11. The computing device of claim 10, wherein the upper surface of each EMI shielding finger contacts either the upper surface of an EMI shielding finger of an adjacent drive carrier of the plurality of drive carriers or the enclosure.

12. The computing device of claim 6, wherein the enclosure is mountable in a rack.

13. A computing system comprising a plurality of computing devices, each computing device comprising:
an enclosure;
a plurality of persistent storage drives; and
a plurality of drive carriers, each drive carrier coupled to the enclosure and a persistent storage drive of the plurality of persistent storage drives and comprising:
  a mounting bracket coupled to a persistent storage drive of the plurality of persistent storage drives;
  a handle coupled to the mounting bracket; and
  an EMI-shielding apparatus disposed between mounting bracket and at least a portion of the handle, the EMI shielding apparatus comprising:
    a plurality of EMI-shielding fingers, each EMI-shielding finger comprising a lower surface, an upper surface approximately parallel to the lower surface, and a contoured surface extending between the lower surface and the upper surface,
    a back plate, and
    at least one arm extending between the back plate and the EMI-shielding finger, wherein each EMI-shielding finger of the plurality of EMI-shielding fingers is coupled to the back plate by the at least one arm extending between the back plate and the EMI-shielding finger.

14. The computing system of claim 13, wherein each EMI-shielding finger of the plurality of EMI-shielding fingers is retractable into the handle.

15. The computing system of claim 14, wherein each EMI-shielding finger of the plurality of EMI-shielding fingers is individually retractable upon a pressure being applied to at least one of the upper surface or the contoured surface of the respective EMI-shielding finger.

16. The computing system of claim 13, wherein side portions of each EMI-shielding finger that are approximately perpendicular to the back plate have an angle within a range of approximately 45 degrees to approximately 60 degrees with respect to a horizontal plane.

17. The computing system of claim 13, wherein the EMI-shielding fingers are positioned in pairs along a length of the back plate and upper surfaces of EMI-shielding fingers of each respective pair of EMI-shielding fingers face opposite directions.

* * * * *